(12) United States Patent
Aiello

(10) Patent No.: US 6,337,503 B1
(45) Date of Patent: Jan. 8, 2002

(54) INTEGRATED POWER CIRCUIT WITH REDUCED PARASITIC CURRENT FLOW

(75) Inventor: Natale Aiello, Catania (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/560,195

(22) Filed: Apr. 28, 2000

(30) Foreign Application Priority Data

Apr. 30, 1999 (EP) .............................. 99830261

(51) Int. Cl.⁷ ............................................ H01L 31/062
(52) U.S. Cl. ....................................... 257/368; 327/512
(58) Field of Search ................................ 257/368, 328, 257/329, 378, 547, 500, 501, 502; 327/512, 513, 564, 565, 108

(56) References Cited

U.S. PATENT DOCUMENTS 5,550,701 A    8/1996   Nadd et al. .................. 361/103
5,612,562 A *  3/1997   Siaudeau et al. ............ 257/328
5,729,040 A *  3/1998   Sano ........................... 257/504
5,763,934 A *  6/1998   Aiello et al. ................. 257/547

FOREIGN PATENT DOCUMENTS

EP    0 512 605 A1    11/1992
EP    0 703 620 A1    3/1996
EP    0 847 089 A1    6/1998

* cited by examiner

Primary Examiner—David Nelms
Assistant Examiner—David Vu
(74) Attorney, Agent, or Firm—Robert Ianucci; Seed IP Law Group, PLLC

(57) ABSTRACT

Presented is an integrated circuit structure having a power transistor in a first well and control circuitry in another well. Between the power and control regions is an intermediate region including a biaging circuit secured to prevent flow of parasitic current from the wells into the substrate by biasing the intermediate region at a value of potential which is tied to the value of potential of the first well. The biasing circuit can include a bipolar transistor.

16 Claims, 3 Drawing Sheets

INTEGRATED POWER CIRCUIT WITH REDUCED PARASITIC CURRENT FLOW

TECHNICAL FIELD

This invention relates to an integrated circuit structure which comprises a power circuit portion and a control circuit portion and is free from parasitic currents.

BACKGROUND OF THE INVENTION

In an integrated electronic structure including a power circuit portion, specifically a bipolar type of power device with a vertical current flow, and a control circuit portion, such as a P-type region, a parasitic PNP transistor is created between the base of the power device and the P region.

FIG. 1 shows a conventional integrated circuit 1' comprising a semiconductor substrate 2' of the N-type which is formed with a first well 3' of the P type provided for forming a power device, and a second well 4', also of the P type, comprising a control region.

In particular, where a bipolar power transistor Power is to be provided, a third well 5' of the N type is formed inside the first well 1', in which the emitter terminal for the bipolar power transistor Power can be formed. The power transistor Power will have its collector terminal in the semiconductor substrate 2' and its base terminal in the first well 3'.

A fourth wall 6', also of the N type, is likewise formed inside the second well 4' and may be connected to a supply voltage reference Vcc, for example.

Consequently, the integrated circuit 1' will include a first parasitic transistor P1, whose emitter terminal is coincident with the base terminal of the bipolar transistor Power, i.e., with the first well 3'. The base terminal of this parasitic transistor is coincident with the collector terminal of the bipolar power transistor Power, i.e., with the semiconductor substrate 2', and its collector terminal is coincident with the second well 4' facing the bipolar power transistor Power.

In order for the first parasitic transistor P1 to be turned off, the value of the potential applied to its base terminal must be at least equal to, or higher than, the value of the potential applied to its emitter terminal.

This condition is always met when the power device Power is operated in the linear range. But in most applications, the power device Power will be operated actually in the saturation range, since it is to serve a switching function.

Under this operating condition, the base-collector junction of the bipolar power transistor Power, and hence the emitter-base junction of the first parasitic transistor P1, would be forward biased.

There practically occurs a current injection from the first well 3', where the power transistor is formed, to the second well 4'. The value of this current is a function of the gain of the first parasitic transistor P1.

The appearance of this current in the second well 4' causes malfunctioning, of the control logic of the integrated circuit 1'. For the integrated circuit 1' to operate correctly, it is necessary that the potential at the second well 4' be lower than, or equal to, the potential at the semiconductor substrate 2' in which the bipolar power transistor Power and control circuit portion are both formed. It is only by meeting this restriction on potentials that the turning on of a second parasitic transistor P2, having its base terminal coincident with the second well 4', emitter terminal coincident with the semiconductor substrate 2', and collector terminal coincident with the fourth well 6', can be prevented.

It should be considered, in particular, that the second well 4' is essentially biased to a reference value Visas through a resistive path which is represented by a resistive element R1. The injected current from the turning on of the first parasitic transistor P1 obeys the following relation;

$$Vbias + R1 * I - V(2) = VbeP2 \quad (1)$$

where,

Vbias is the bias voltage of the second well 4';

R1 is the resistance of the resistive path inside the second well 4';

I is the current injected into the second well 4' from the turning on of the first parasitic transistor P1;

V(2) is the value of the potential applied to the semiconductor substrate 2'; and VbeP2 is the base-emitter voltage of the second parasitic transistor P2;

the parasitic transistor P2 is turned on, causing malfunction to occur in the control region of the integrated circuit.

A first known technical solution to the problem posed by the presence of parasitic transistors provides for that area of the semiconductor substrate 2' that lies intermediate between the first well 3' and the second 4' to be doped more heavily. In this way, the gain of the first parasitic transistor P1 is reduced.

However, this doping must not be carried too far, if the integrated circuit 1' is to be held at the correct voltage. In addition, the flow of current between the wells of the P type is reduced but not eliminated, with this solution.

A second solution provides for increased spacing of the P-wells. However, not even this solution ig effective to suppress the flow of current brought about by the turning on of parasitic transistors.

A third solution provides for an intermediate region 7', also of the P type, to be included between the aforementioned P-wells, as shown schematically in FIG. 2.

Unfortunately, this solution also has several drawbacks:

First, where the intermediate region 7' is a floating region, a self-biasing of the intermediate region 7' to the value of potential of the first well 3' is precipitated upon a parasitic PNP transistor P1', associated with the well 3' and the intermediate region 7', entering its saturation range. As a result, an additional parasitic transistor P1", associated with the second well 4' and tho region 7', is caused to move into its conduction range. The net effect of providing this intermediate region 7' is one of lowering the current gain of the parasitic elements as a whole: the net effect of the parasitic components is split between the two transistors, P1' and P1", but one (P1') of them will be in its saturation range.

Second, when the intermediate reio 7' is connected to a voltage reference, e.g., to ground, and by reason of the application involved the second well 4' is biased to a potential level below ground, the parasitc transistor P1" will move into its conduction range and draw current from the ground reference terminal to the second well 4'.

Therefore the prior art does not adequately solve the problems of parasitic flow of current in these types of integrated circuits due to parasitic components.

SUMMARY OF THE INVENTION

Presented is an integrated circuit comprising a power device and a control region that has structural and functional features that eliminates the parasitic flow of current. The circuit is formed on a semiconductor substrate with conductivity of a first type, and incorporates a first circuit portion incorporated in a first well that includes at least one power transistor. The circuit also has a control circuit portion incorporated in a second well, and an intermediate region located between the first and second circuit portions. The conductivity of the first well, second well, and intermediate region are all of a second type. The intermediate region between the wells is biased as a function of the potential of the well wherein the power device is formed.

The features and advantages of an integrated circuit structure according to the invention will become apparent from the following description of an embodiment thereof, given by way of non-limitative example with reference to the accompanying drawings.

DETAILED DESCRIPTION OF THE INVENTION

Figure 1:
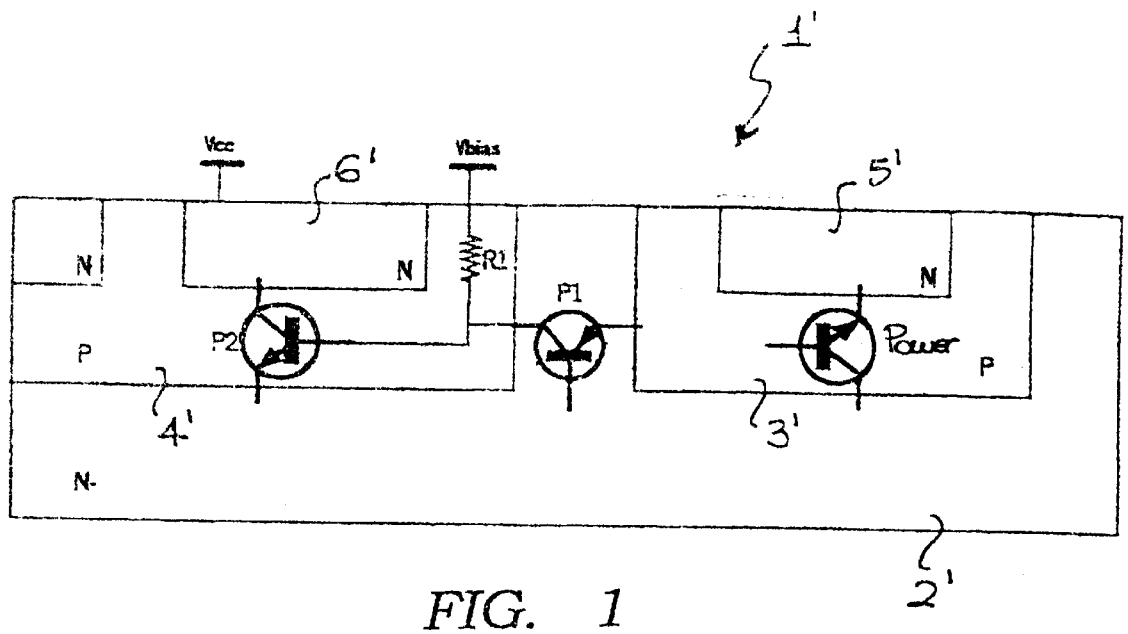
FIG. 1 is a diagram showing a cross section of an integrated circuit that includes at least one power device and a control region, according to the prior art.
Figure 2:
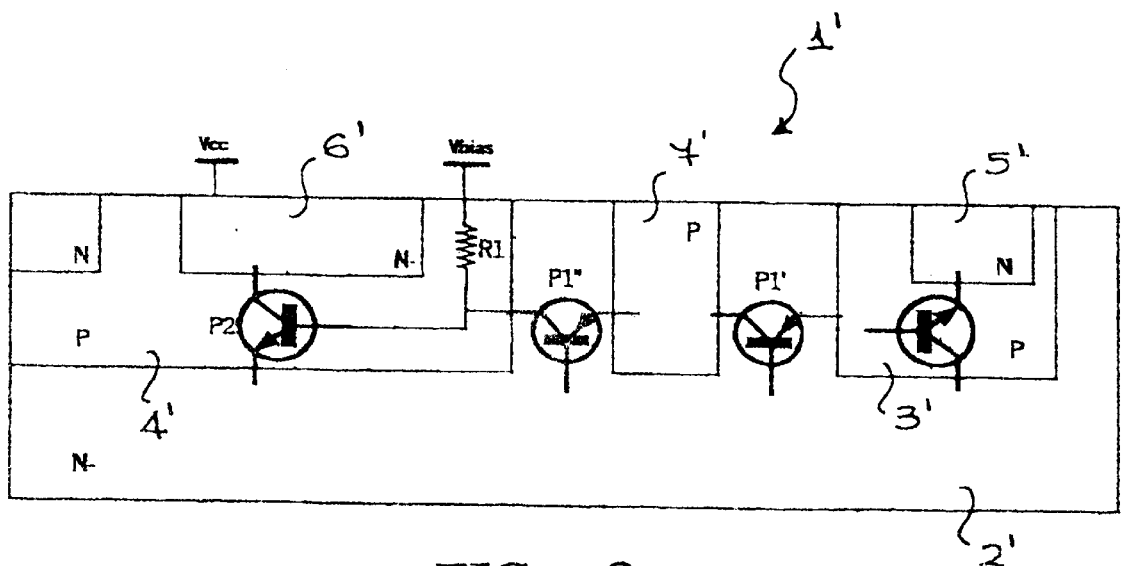
FIG. 2 is a diagram showing a cross section of an alternative embodiment of the integrated circuit of FIG. 1.
Figure 3:
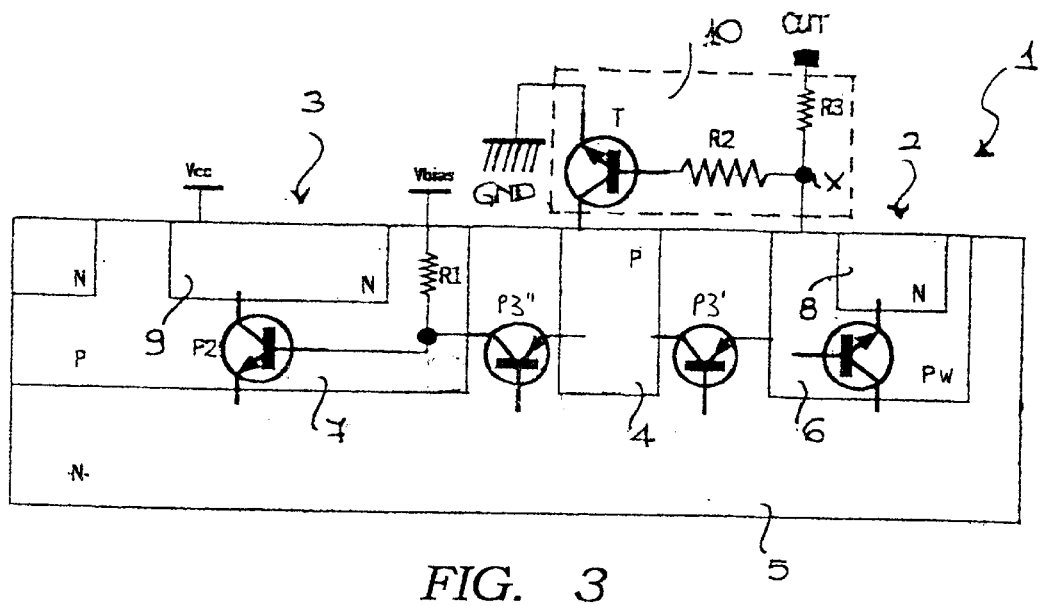
FIG. 3 is a diagram showing a cross section of an integrated circuit according to an embodiment of this invention, which includes at least one power circuit portion and a control circuit portion.

Referring to the drawing views, specifically to the example of FIG. 3, an integrated electronic circuit is shown generally and schematically at 1 which includes a power circuit portion comprising at least one power device 2, and which includes a control circuit portion 3. A region 4 is provided intermediate the first and second circuit portions.

In particular, the integrated circuit 1 comprises a semiconductor substrate 5 of the N-type which has a first well 6 of the P type and a second well 7 of the P type formed therein for respectively accommodating the power device 2 and the control circuit portion or region 3.

Formed respectively inside the first 6 and second 7 wells are additional wells 8 and 9 of the N type. In particular, the well 9 inside the second well 7 will be connected, illustratively, to a supply voltage reference Vcc to create the control region 3. Further, the second well 7 is essentially biased to a bias voltage reference Vbias through a resistive path represented by a resistive element R1.

The bipolar power device PW is as arranged to have all emitter terminal within the well 8, a collector terminal in the semiconductor substrate 5, and a base terminal within the first well 6.

The presence of NPN junctions at the wells 6 and 7 of the P type, combined with a semiconductor substrate 5 of the N type, originates parasitic components. In particular, the integrated circuit 1 has a first parasitic transistor P2 whose emitter terminal is coincident with the semiconductor substrate 5, collector terminal is coincident with the well 9, and base terminal is coincident with the second well 7. Its base terminal will, therefore, be biased to the bias voltage reference Vbias via the resistive element R1.

As previously mentioned in connection with the conventional integrated circuit, an intermediate region 4, also of the P type, is provided between the first well 6 and the second well 7 and substantially splits, between second P3' and third P3" parasitic transistors, the parasitic effect of the PNP junction linked to said P-wells 6 and 7 associated with the semiconductor substrate 5 of the N type.

In particular, the second parasitic transistor P3' has its emitter terminal coincident with the first well 6, collector terminal coincident with the intermediate region 4, and base terminal coincident with the semiconductor substrate 5. Likewise, the third parasitic transistor P3" has its emitter terminal coincident with the intermediate region 4, as collector terminal coincident with the second well 7, and base terminal coincident with the semiconductor substrate 5.

Advantageously in this embodiment, a circuit is arranged to bias the intermediate region 4, differently, according to the potential applied to the first well 6. This circuit includes a biasing circuit 10 connected to the intermediate region 4 and the first well 6.

More particularly, the biasing circuit 10 comprises a bipolar transistor T having its emitter terminal connected to a voltage reference such as ground GND, collector terminal connected to the intermediate region 4, and base terminal connected to an output terminal OUT of the biasing circuit 10 through a series of first R2 and second R3 resistive elements.

In addition, a circuit node X intermediate the first R2 and second R3 resistive elements is connected to the first well 6.

Any suitable controlled switch could be substituted for the transistor T.

The use of a bipolar transistor T makes for a simple overall construction of the integrated circuit. In fact, a bipolar transistor T can be readily formed either inside the second well 7, i.e., in the control circuit portion of the integrated circuit, or within the intermediate region 4 itself. In particular, efficiency largely benefits from the transistor T being formed in the intermediate region 4.

To make the operation of the integrated circuit containing a biasing circuit 10 according to embodiments of the invention more easily understood, its equivalent circuit, shown in FIG. 4 will be discussed first.

Figure 4:
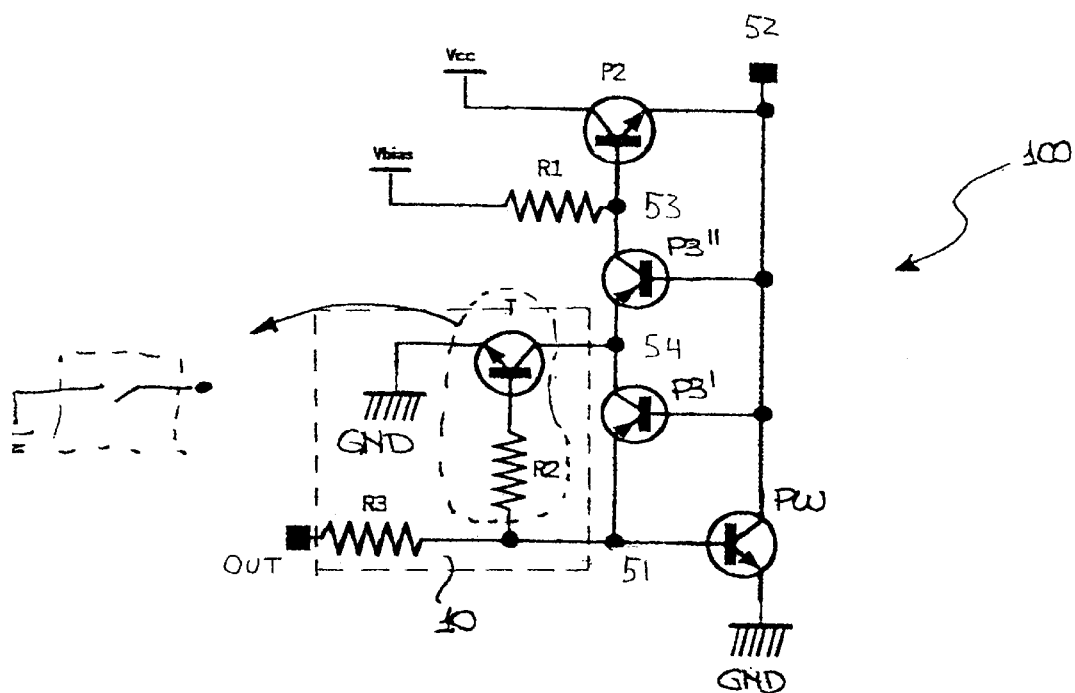
FIG. 4 shows a schematic diagram of the integrated circuit created by the structure of FIG. 3.

In particular, the equivalent circuit 100 of FIG. 4 comprises a power transistor PW which has an emitter terminal connected to the ground reference GND, a base terminal connected to a first node 51, corresponding to the first well 6, and a collector terminal connected to a second node 52, corresponding to the semiconductor substrate 5.

The equivalent circuit 100 also includes a parasitic transistor P2 having a collector terminal connected to the supply voltage reference Vcc, an emitter terminal connected to the second node 52, and a base terminal connected to a third node 53 corresponding to the second well 7.

As previously explained, the third node 53 is connected to a bias voltage reference Vbias through a resistive element R1.

Finally, the equivalent circuit 100 includes a parasitic transistor P3' and a parasitic transistor P3", which are connected in series with each other between the first node 51 and the third node 53 and have their base terminals connected to the second node 52.

The parasitic transistors P3' and P3" are connected together at a fourth node 54, corresponding to the intermediate region 4 and itself connected to the collector terminal of the transistor T in the biasing circuit 10.

The transistor T also has its emitter terminal connected to the ground reference GND, and its base terminal connected to the intermediate circuit node X via the resistive element R2. The intermediate circuit node X is connected to the first node 51, and connected to the output terminal OUT of the biasing circuit 10 via the resistive element R3.

The combination of the transistor T and the resistive element R2 operates like a switch connected between the fourth node 54 and ground GND and controlled by the potential at the first node 51 that is at the base terminal of the power device PW. Thus, the resistive element R2 functions as a decoupling element.

Against the background of the equivalent circuit 100 just described, the circuit action under different conditions of operation follows.

When the power device PW is in the ON state, the collector terminal can either have a value of potential close to the ground reference GND value ("saturated device") or a value of a few Volts ("unsaturated device"), while the base terminal is set at the value of the base-emitter voltage (Vbe) in the conduction range;

When the power device PW is in the OFF state, the collector terminal goes to a high voltage value which will be specific to a particular application.

It should be noted that, with the power device PW in the ON state, its collector terminal may also go to a negative potential. In this case, a current would be caused to flow from the ground reference to the semiconductor substrate 5; therefore, the integrated circuit is normally provided with a diode which has its anode connected to the ground reference and its cathode connected to the semiconductor substrate 5.

In the instance of an unsaturated device being ON, its base-emitter junction is always reverse biased, and the parasitic transistors P3', P3" would be OFF regardless of the value of the potential at which the intermediate region 4 is biased.

In this case, the transistor T of the biasing circuit 10 would be ON, and the intermediate region 4 biased all the same at the ground reference value.

In the instance of a saturated device being ON, its base-emitter junction is forward biased, and the parasitic transistor P3' would be ON, whereby a current would be injected into the intermediate region 4.

Advantageously in this embodiment of the invention, the transistor T of the biasing circuit 10 would be ON in this case, and drains this current back to the ground reference, thereby preventing the current from reaching the second well 7 through the parasitic transistor P3".

Furthermore, the biasing circuit 10 keeps the potential applied to the intermediate region 4 at a lower value than, or the same value as, that of the semiconductor substrate 5, thereby ensuring that the parasitic transistor P3" is turned off. In fact, this parasitic transistor P3" has its base-emitter voltage Vbe near zero and, accordingly, will be "off" regardless of the value of potential at the second well 7.

In the event of the device being ON in a "below ground" condition, that is for high values of the potential at its external base terminal or contact, the value of the potential at the collector terminal would be normally clamped at 0.7V through a diode in parallel with the power device itself.

When the semiconductor substrate 5 is at a value of potential equal to −0.7V, the first well 6, intermediate region 4, and second well 7 will all have a value of potential of approximately 0V, and the PN junctions (i.e., the diodes) formed by the above regions and the semiconductor substrate 5 will be forward biased.

Advantageously, the transistor T of the biasing circuit 10 would be OFF in this case, since its base and collector terminals are at the same value of potential, which. value is lower than, or equal to, the value of the potential at the emitter terminal, which is at the ground reference value.

Thus, the intermediate region 4 is "disjoined" from the biasing circuit 10, ensuring isolation of the voltage at the collector terminal of the power device from the regions 6 and 7.

In this way, the conduction of the parasitic transistor P3" and consequent injection of current into the second well 7 are prevented.

Lastly, with a device in the OFF state, the value of potential of the semiconductor substrate 5 will always be higher than the value of potential of the P regions, and no parasitic PNP transistors would be ON between said regions and the semiconductor substrate 5.

Figure 5:
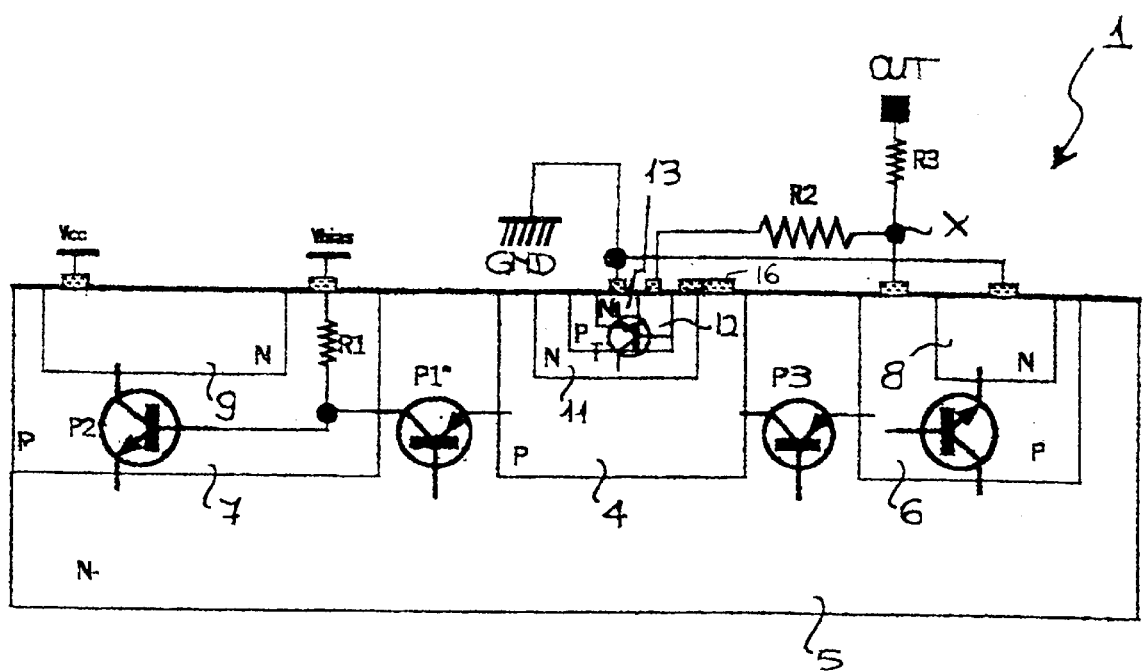
FIG. 5 is a diagram showing a cross section of an integrated circuit according to another embodiment of the invention.

FIG. 5 is a diagram showing a practical embodiment of the integrated circuit with biasing circuit 10, wherein the circuit 10 comprises a bipolar transistor T formed in the intermediate region 4.

In particular, a first interior well 11 of the N type, providing the collector terminal for the bipolar transistor T, is formed in the intermediate region 4.

Inside this first interior well 11 there are diffused a second interior well 12 of the P type, providing the base terminal for the bipolar transistor T, and a third interior well 13 of the N type which provides the emitter terminal for the transistor T and is diffused inside the second interior well 12.

Advantageously, the first interior well 11 is connected to the intermediate region 4 by an external short circuit 16. In particular, this external short circuit 16 is produced in an area of the intermediate region which is facing the first well 6 that accommodates the power device PW.

Further, the second interior well 12 is connected to the first well 6 through the resistive element R2, and connected to the output terminal OUT of the biasing circuit 10 through the additional resistive element R3.

Finally, the third interior well 13 is connected to the ground reference GND.

To summarize, with an integrated circuit incorporating embodiments of this invention, all current that flows due to the presence of parasitic PNP transistors between the P-type wells and the N-type substrate can be cut off, through the intermediate region 4 of the P type being connected between the power circuit portion and the control portion and biased by means of the biasing circuit 10 to suit varying conditions of the power device, operation.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. An integrated circuit structure formed in a semiconductor substrate having a first type, the circuit comprising:
   a power circuit portion incorporated into a first well having a second type and including at least one power transistor;
   a control circuit portion incorporated into a second well having the second type;
   an intermediate region having the second type and located between said power circuit and control circuit portions, a circuit means structured to bias said intermediate region at a value of potential tied to a value of potential of said first well, thereby cutting off a flow of parasitic current from said wells to said semiconductor substrate.

2. The integrated circuit structure according to claim 1 wherein said circuit means for biasing the intermediate region comprises a biasing circuit connected to said intermediate region and said first well and including at least one controlled switch.

3. The integrated circuit structure according to claim 2 wherein said controlled switch includes a first terminal connected to a voltage reference, a second terminal connected to said intermediate region, and a control terminal connected to an output terminal of the biasing circuit.

4. The integrated circuit structure according to claim 3 wherein said biasing circuit further comprises first and second resistive elements connected between said control terminal of said controlled switch and said output terminal of the biasing circuit.

5. The integrated circuit structure according to claim 3 wherein said controlled switch comprises a bipolar transistor having an emitter terminal connected to said voltage reference, a collector terminal connected to said intermediate region, and a base terminal connected to said output terminal of the biasing circuit.

6. The integrated circuit structure according to claim 5 wherein said bipolar transistor is formed inside said second well.

7. The integrated circuit structure according to claim 5 wherein said bipolar transistor is formed within said intermediate region.

8. The integrated circuit structure according to claim 7 wherein said intermediate region is formed with a first interior well having the first type of conductivity, that a second interior well having the second type of conductivity is formed inside said first interior well, and that a third interior well having the first type of conductivity is formed inside said second interior well.

9. The integrated circuit structure according to claim 8 wherein said first interior well is linked to said intermediate region through an external short circuit produced in an area of the intermediate region that faces said first well.

10. An integrated circuit formed in a semiconductor substrate having a first conductivity type, the circuit comprising:
    a first well formed in the substrate, the first well having a second conductivity type and containing a power transistor;
    a second well formed in the substrate the second well having the second conductivity type and containing a control circuit;
    an intermediate region having the second conductivity type and located in a portion of the substrate between the first and second wells, and
    a bias circuit structured to bias the intermediate region to a voltage value that prevents a parasitic current flow.

11. The integrated circuit of claim 10 wherein the bias circuit is coupled to the intermediate region and to the first well and wherein the bias circuit includes at least one controlled switch.

12. The integrated circuit of claim 11 wherein the controlled switch is a bipolar transistor and has an emitter terminal connected to a reference voltage, a collector, terminal connected to the intermediate region, and a base terminal connected to an output terminal of the bias circuit.

13. The integrated circuit structure of claim 12 wherein the bipolar transistor is formed within the intermediate region.

14. The integrated circuit of claim 13 wherein the intermediate region comprises:
    a first interior well having the first conductivity type,
    a second interior well having the second conductivity type formed within the first interior well; and
    a third interior well having the first conductivity type formed within the second interior well.

15. The integrated circuit of claim 14, further comprising an external short circuit coupling the first interior well to a portion of the intermediate region that does not contain the first interior well.

16. The integrated circuit of claim 10 wherein the bias circuit is structured to bias the intermediate region to a voltage value that prevents a parasitic current flow from the first and second wells to the semiconductor substrate.

* * * * *